(12) United States Patent
Chang

(10) Patent No.: US 11,641,161 B1
(45) Date of Patent: May 2, 2023

(54) CHARGE PUMP CIRCUIT

(71) Applicant: GUTSCHSEMI LIMITED, Hong Kong (HK)

(72) Inventor: Kuo-Wei Chang, Taipei (TW)

(73) Assignee: GUTSCHSEMI LIMITED, Hong Kong (HK)

( * ) Notice: Subject to any disclaimer, the term of this patent is extended or adjusted under 35 U.S.C. 154(b) by 0 days.

(21) Appl. No.: 17/692,022

(22) Filed: Mar. 10, 2022

Related U.S. Application Data

(60) Provisional application No. 63/280,555, filed on Nov. 17, 2021.

(30) Foreign Application Priority Data

Jan. 18, 2022 (TW) .................................. 111102046

(51) Int. Cl.
*H02M 3/07* (2006.01)
*G11C 5/14* (2006.01)
(52) U.S. Cl.
CPC ............. *H02M 3/076* (2021.05); *G11C 5/145* (2013.01)
(58) Field of Classification Search
None
See application file for complete search history.

(56) References Cited

U.S. PATENT DOCUMENTS

| | | | | | |
|---|---|---|---|---|---|
| 4,271,461 | A * | 6/1981 | Hoffmann | ................ | H02M 3/07 327/535 |
| 6,198,340 | B1 * | 3/2001 | Ting | ...................... | H02M 3/073 327/390 |
| 6,995,603 | B2 * | 2/2006 | Chen | ...................... | H02M 3/073 363/60 |
| 7,602,231 | B2 * | 10/2009 | Yamamoto | .............. | H02M 3/07 363/60 |
| 7,656,688 | B2 * | 2/2010 | Yeh | .......................... | H02M 3/07 363/60 |

(Continued)

FOREIGN PATENT DOCUMENTS

| | | | |
|---|---|---|---|
| CN | 101674011 B | * 5/2012 | |
| CN | 108809084 A | * 11/2018 | .............. H02M 3/07 |

(Continued)

OTHER PUBLICATIONS

"Office Action of Taiwan Counterpart Application", dated Jan. 10, 2023, p. 1-p. 8.

*Primary Examiner* — Thomas J. Hiltunen
(74) *Attorney, Agent, or Firm* — JCIPRNET

(57) ABSTRACT

A charge pump circuit is provided. The charge pump circuit includes a dual-phase charge pump, a first load switch, a second load switch, and a control circuit. The dual-phase charge pump performs a voltage pumping operation on a power source in response to a first clock and a second clock to generate a first pumping voltage at a first node and a second pumping voltage at a second node. The control circuit controls the first load switch in response to a third clock and controls the second load switch in response to a fourth clock. In a period during which the first load switch is turned off, the second load switch transfers the first pumping voltage to an output terminal of the charge pump circuit. In a period during which the second load switch is turned off, the first load switch transfers the second pumping voltage to the output terminal.

9 Claims, 6 Drawing Sheets

(56) References Cited

U.S. PATENT DOCUMENTS

| | | | | |
|---|---|---|---|---|
| 8,816,754 | B1* | 8/2014 | Clark | H03K 17/145 |
| | | | | 327/534 |
| 9,379,605 | B2* | 6/2016 | Sulkin | H03K 3/356121 |
| 9,634,559 | B2* | 4/2017 | Kim | H02M 3/07 |
| 10,020,029 | B1* | 7/2018 | Tan | G11C 5/145 |
| 2014/0077868 | A1* | 3/2014 | Kalluru | G11C 5/145 |
| | | | | 327/536 |
| 2020/0127559 | A1 | 4/2020 | Hu et al. | |

FOREIGN PATENT DOCUMENTS

| | | |
|---|---|---|
| TW | 200832877 | 8/2008 |
| TW | 201001888 | 1/2010 |
| TW | I666865 | 7/2019 |

\* cited by examiner

CHARGE PUMP CIRCUIT

CROSS-REFERENCE TO RELATED APPLICATION

This application claims the priority benefit of U.S. provisional application Ser. No. 63/280,555, filed on Nov. 17, 2021, and Taiwan application serial no. 111102046, filed on Jan. 18, 2022. The entirety of each of the above-mentioned patent applications is hereby incorporated by reference herein and made a part of this specification.

BACKGROUND

Technical Field

The disclosure relates to a charge pump circuit, and in particular, relates to a charge pump circuit exhibiting high efficiency.

Description of Related Art

FIG. 1 is a schematic diagram of an existing and common dual-phase charge pump circuit 10. The dual-phase charge pump circuit 10 includes a dual-phase charge pump 11 and transfer transistors P1 and P2. The dual-phase charge pump 11 includes power transistors M1 and M2 and capacitors C3 and C4. A first terminal of the power transistor M1 is coupled to a power source VDDA. A second terminal and a control terminal of the power transistor M1 are coupled to a node ND1. A first terminal of the power transistor M2 is coupled to the power source VDDA. A second terminal and a control terminal of the power transistor M2 are coupled to a node ND2. A capacitor C1 is coupled between the node ND1 and the clock CK1. A capacitor C2 is coupled between the node ND2 and the clock CK2. A first terminal and a control terminal of the transfer transistor P1 are coupled to the node ND2. A second terminal of the transfer transistor P1 is coupled to an output terminal. A first terminal and a control terminal of the transfer transistor P2 are coupled to the node ND1. A second terminal of the transfer transistor P2 is coupled to the output terminal.

During operation, when the clock CK1 transitions from a low voltage level to a high voltage level, the clock CK2 transitions from a high voltage level to a low voltage level. The transfer transistor P1 is turned off. The transfer transistor P2 is turned on. Therefore, the transfer transistor P2 may provide a pumping voltage at the node ND1 to the output terminal. When the clock CK1 transitions from the high voltage level to the low voltage level, the clock CK2 transitions from the low voltage level to the high voltage level. The transfer transistor P2 is turned off. The transfer transistor P1 is turned on. Therefore, the transfer transistor P1 may provide a pumping voltage at the node ND2 to the output terminal.

However, the capacitors C3 and C4 may delay charging and discharging on the nodes ND1 and ND2. The above-mentioned delay may delay the turning-off time point of the transfer transistors P1 and P2, and a reverse leakage current Irev is thereby generated. For instance, when the clock CK1 transitions from the low voltage level to the high voltage level and the clock CK2 transitions from the high voltage level to the low voltage level, the transfer transistor P2 provides the pumping voltage located at the node ND1 to the output terminal. The discharging of the node ND2 is delayed. The transfer transistor P1 is not turned off in time. As such, the power supplied to the pumping voltage of the output terminal may flow back to the power source VDDA via the transfer transistor P1 and the turned-on power transistor M2, and the reverse leakage current Irev is thereby generated. Therefore, the dual-phase charge pump circuit 10 may exhibit low efficiency.

SUMMARY

The disclosure provides a charge pump circuit exhibiting high efficiency.

A charge pump circuit provided by the disclosure includes a dual-phase charge pump, a first load switch, a second load switch, and a control circuit. The dual-phase charge pump performs a voltage pumping operation on a power source in response to a first clock and a second clock to generate a first pumping voltage at a first node and a second pumping voltage at a second node. The first load switch is coupled between the second node and an output terminal of the dual-phase charge pump. The second load switch is coupled between the first node and the output terminal. The control circuit is coupled to the first load switch and the second load switch. The control circuit controls the first load switch in response to a third clock and controls the second load switch in response to a fourth clock. In a period during which the first load switch is turned off, the second load switch transfers the first pumping voltage to the output terminal. In a period during which the second load switch is turned off, the first load switch transfers the second pumping voltage to the output terminal.

To sum up, in the disclosure, the charge pump circuit controls the first load switch and the second load switch through the control circuit. Further, the control circuit controls the first load switch in response to the third clock and controls the second load switch in response to the fourth clock. In the period during which the second load switch is turned off, the first load switch transfers the first pumping voltage to the output terminal. In the period during which the first load switch is turned off, the second load switch transfers the second pumping voltage to the output terminal. In the disclosure, the reverse leakage current is not generated in the charge pump circuit. Therefore, the efficiency of the charge pump circuit may be improved.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
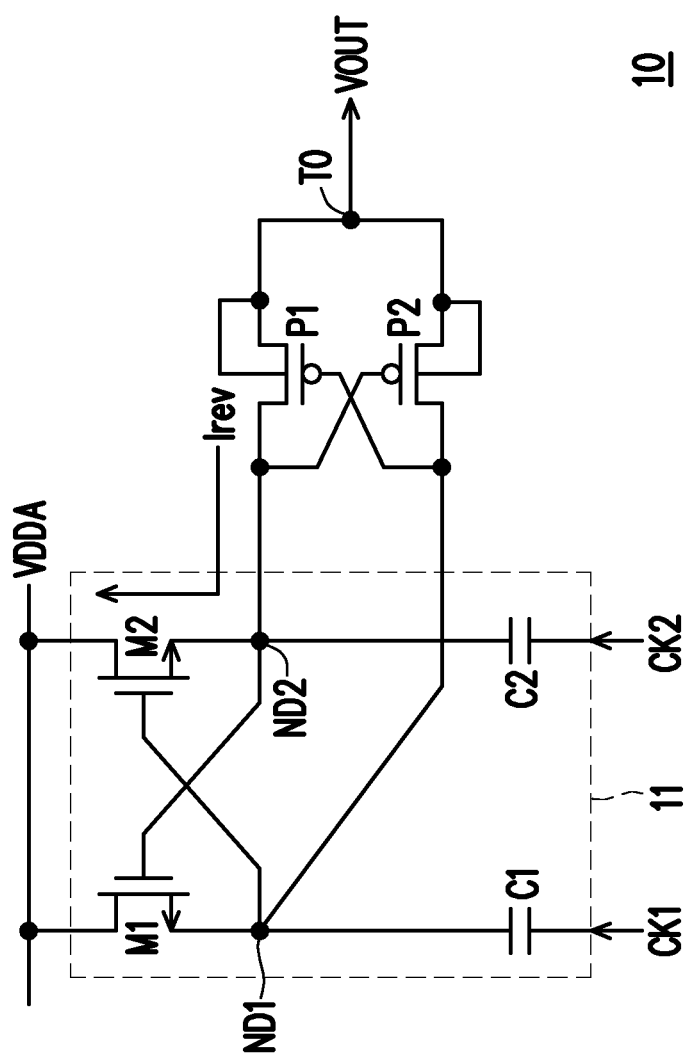
FIG. 1 is a schematic diagram of an existing common dual-phase charge pump circuit.

Several embodiments of the disclosure are described in detail below accompanying with figures. In terms of the reference numerals used in the following descriptions, the same reference numerals in different figures should be considered as the same or the like elements. The embodiments are only a portion of the disclosure, which do not present all embodiments of the disclosure. More specifically, these embodiments are only examples in the scope of the patent application of the disclosure.

Figure 2:
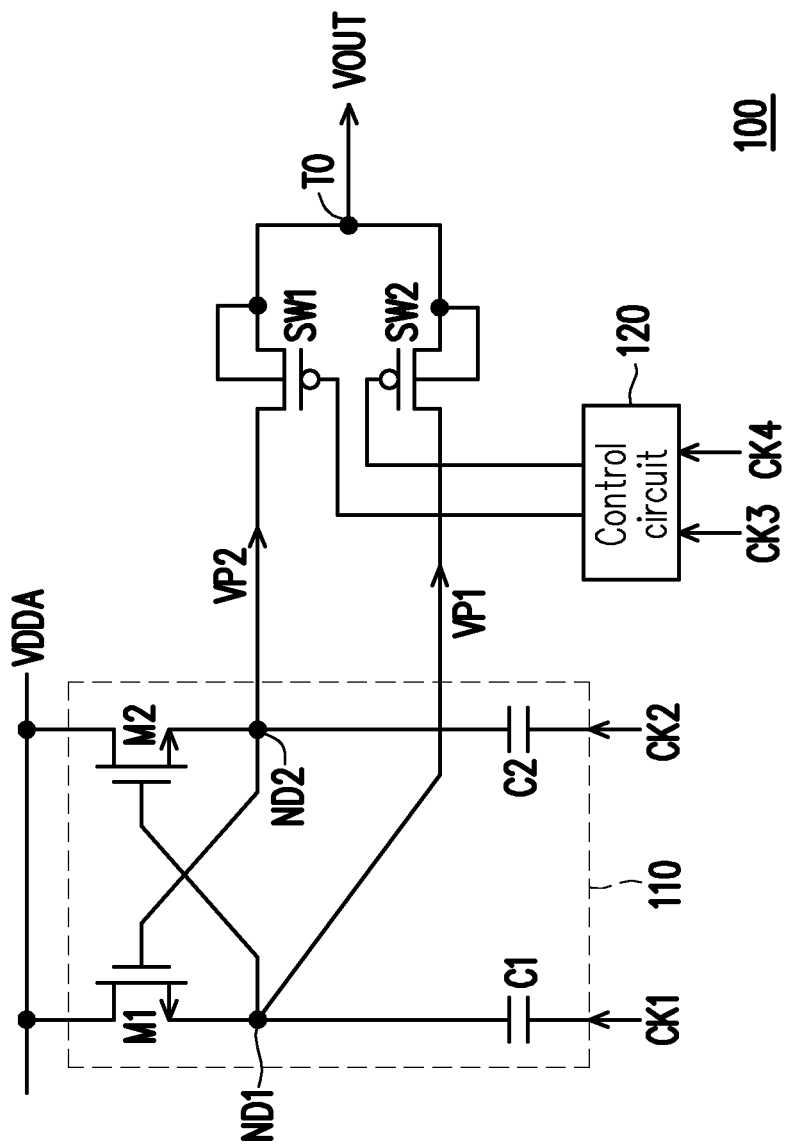
FIG. 2 is a schematic diagram illustrating a charge pump circuit according to a first embodiment of the disclosure.

With reference to FIG. 2, FIG. 2 is a schematic diagram illustrating a charge pump circuit according to a first embodiment of the disclosure. In this embodiment, a charge pump circuit 100 includes a dual-phase charge pump 110, load switches SW1 and SW2, and a control circuit 120. The dual-phase charge pump 110 performs a voltage pumping operation on a power source VDDA in response to clocks CK1 and CK2. Therefore, the dual-phase charge pump 110 generates a pumping voltage VP1 at a node ND1 and generates a pumping voltage VP2 at a node ND2. Voltage values of the pumping voltages VP1 and VP2 are greater than a voltage value of the power source VDDA.

In this embodiment, the dual-phase charge pump 110 includes power transistors M1 and M2 and capacitors C1 and C2. A first terminal of the power transistor M1 is coupled to the power source VDDA. A second terminal of the power transistor M1 and a control terminal of the power transistor M1 are coupled to the node ND1. A first terminal of the power transistor M2 is coupled to the power source VDDA. A second terminal of the power transistor M2 and a control terminal of the power transistor M2 are coupled to the node ND2. The capacitor C1 is coupled between the node ND1 and the clock CK1. The capacitor C2 is coupled between the node ND2 and the clock CK2. In this embodiment, when the clock CK1 is at a high voltage level and the clock CK2 is at a low voltage level, a voltage at the node ND1 is pumped up to generate a pumping voltage VP1. A voltage of the node ND2 is restored to a voltage value substantially equal to a voltage value of the power source VDDA. When the clock CK2 is at a high voltage level and the clock CK1 is at a low voltage level, a voltage at the node ND2 is pumped up to generate a pumping voltage VP2. A voltage of the node ND1 is restored to a voltage value substantially equal to the voltage value of the power source VDDA.

In this embodiment, the load switch SW1 is coupled between the node ND2 and an output terminal TO of the dual-phase charge pump circuit 100. The load switch SW2 is coupled between the node ND1 and the output terminal TO of the dual-phase charge pump circuit 100. The control circuit 120 is coupled to the load switches SW1 and SW2. The control circuit 120 controls the load switch SW1 in response to the clock CK3 and controls the load switch SW2 in response to the clock CK4. In a period during which the load switch SW1 is turned off, the load switch SW2 transfers the pumping voltage VP1 to the output terminal TO. Therefore, the pumping voltage VP1 transferred to the output terminal TO is treated as an output voltage VOUT. In a period during which the load switch SW2 is turned off, the load switch SW1 transfers the pumping voltage VP2 to the output terminal TO. Therefore, the pumping voltage VP2 transferred to the output terminal TO is treated as the output voltage VOUT.

It is worth noting that the control circuit 120 controls the load switches SW1 and SW2 based on the clocks CK3 and CK4. In the period during which the load switch SW1 is turned off, the load switch SW2 transfers the pumping voltage VP1 to the output terminal TO. Power of the output voltage VOUT is not fed back to the power source VDDA through the turned-off load switch SW1. In the period during which the load switch SW2 is turned off, the load switch SW1 transfers the pumping voltage VP2 to the output terminal TO. The power of the output voltage VOUT is not fed back to the power source VDDA through the turned-off load switch SW2. In operation, the dual-phase charge pump 110 is not provided with a reverse leakage current. In this way, efficiency of the charge pump circuit 100 may be improved.

Each of the load switches SW1 and SW2 is implemented by a transistor or a transfer gate in any form. Taking this embodiment as an example, each of the load switches SW1 and SW2 is implemented by a P-type metal-oxide-semiconductor field-effect transistor (MOSFET).

Figure 3:
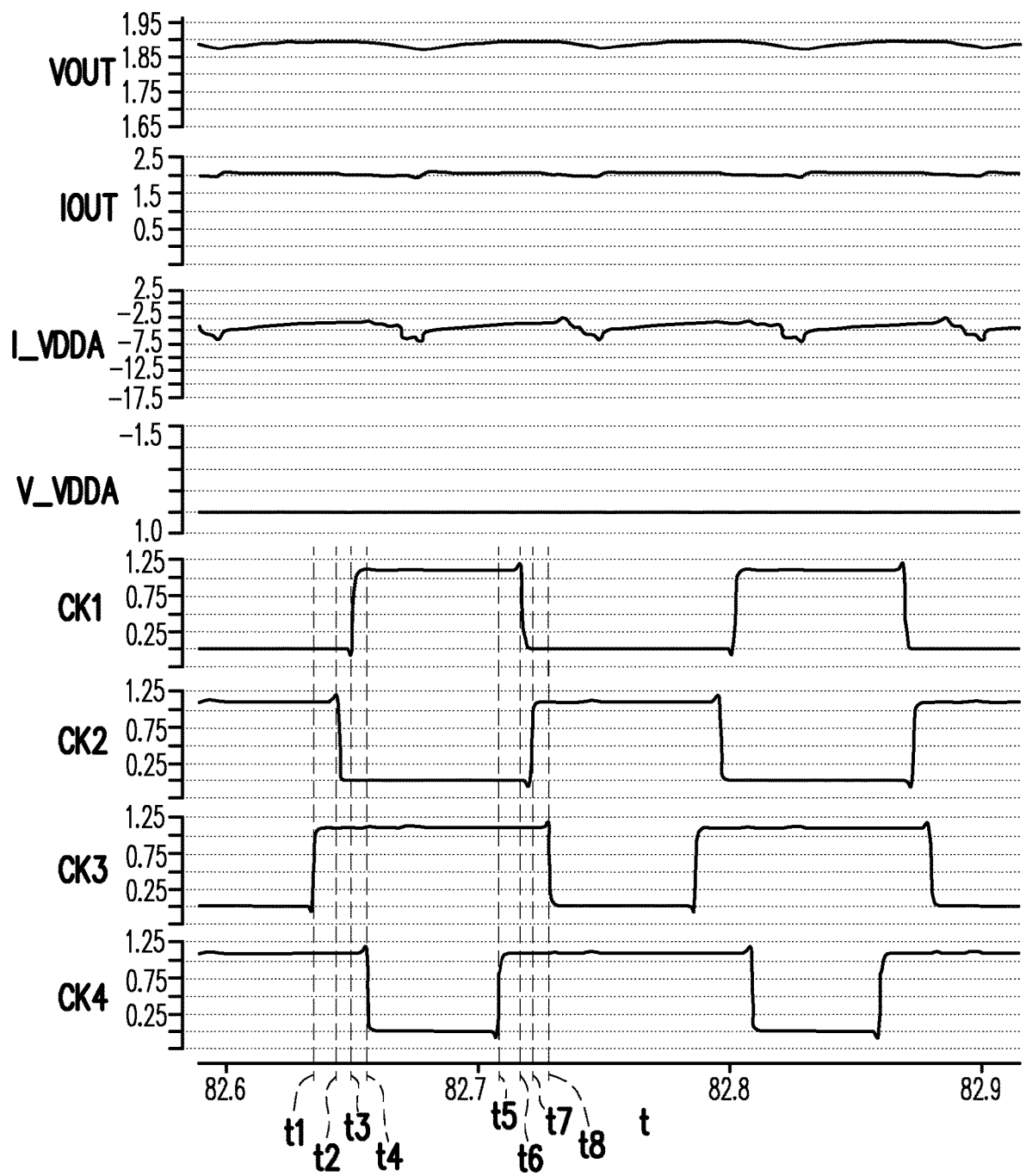
FIG. 3 is a graph illustrating signal waveforms according to an embodiment of the disclosure.

With reference to FIG. 2 and FIG. 3 together, FIG. 3 is a graph illustrating signal waveforms according to an embodiment of the disclosure. The graph of signal waveforms shows a waveform of the output voltage VOUT, a waveform of an output current IOUT, a waveform of a voltage V_VDDA of the power source VDDA, a waveform of a current I_VDDA of the power source VDDA, and waveforms of the clocks CK1 to CK4. The horizontal axis of the graph of signal waveforms is uniformly represented by time t. The unit of time t is micro seconds (μs).

At a time point t1, the clock CK3 transitions from a low voltage level to a high voltage level. The load switch SW1 is turned off in response to the high voltage level of the clock CK3. Immediately after the time point t1, the clock CK2 transitions from a high voltage level to a low voltage level at a time point t2. The clock CK1 transitions from a low voltage level to a high voltage level at a time point t3. Therefore, the voltage at the node ND1 may start to be pumped up at the time point t3 to generate the pumping voltage VP1. A voltage value of the node ND2 is restored to a voltage value substantially equal to the voltage value of the power source VDDA. In this embodiment, a transition time point (i.e., the time point t3) at which the clock CK1 transitions from the low voltage level to the high voltage level is later than the time point t1. That is, the time point (i.e., the time point t3) at which the pumping voltage VP1 starts to be generated is later than the time point at which the load switch SW1 is turned off.

Next, at a time point t4, the clock CK4 transitions from a high voltage level to a low voltage level. The load switch SW2 is turned on in response to the low voltage level of the clock CK4. The time point t4 at which the load switch SW2 is turned on is later than the time point t3. That is, the control circuit 120 turns on the load switch SW2 after the pumping voltage VP1 is generated.

At a time point t5, the clock CK4 transitions from the low voltage level to the high voltage level. The load switch SW2 is turned off in response to the high voltage level of the clock CK4. Immediately after the time point t5, the clock CK1 transitions from the high voltage level to the low voltage level at a time point 16. The clock CK2 transitions from the low voltage level to the high voltage level at a time point t7. Therefore, the voltage at the node ND2 may start to be pumped up at the time point t7 to generate the pumping voltage VP2. The voltage value of the node ND1 is restored to a voltage value substantially equal to the voltage value of the power source VDDA. In this embodiment, the transition time point (i.e., the time point t7) at which the clock CK2 transitions from the low voltage level to the high voltage level is later than the time point (i.e., the time point t5) at which the load switch SW2 is turned off. That is, the time point (i.e., the time point t7) at which the pumping voltage VP2 starts to be generated is later than the time point at which the load switch SW2 is turned off.

Next, at a time point t8, the clock CK3 transitions from the high voltage level to the low voltage level. The load switch SW1 is turned on in response to the low voltage level of the clock CK3. The time point t8 at which the load switch SW2 is turned on is later than the time point t7. That is, the control circuit 120 turns on the load switch SW1 after the pumping voltage VP2 is generated.

In a time interval from the time point t1 to the time point t8, the load switch SW1 is in an off state. The pumping voltage VP1 is generated only in the period during which the load switch SW1 is determined to be in the off state. In addition, in the period during which the pumping voltage VP1 is generated (i.e., a time interval from the time point t3 to the time point t6), the load switch SW2 is turned on in a time interval from the time point t4 to the time point t5. In this way, the reverse leakage current flowing through the load switch SW1 may not be generated.

Similarly, the pumping voltage VP2 is generated only in the period during which the load switch SW2 is determined to be in the off state. In addition, in the period during which the pumping voltage VP2 is generated, the load switch SW1 is turned on. In this way, the reverse leakage current flowing through the load switch SW2 may not be generated.

In this embodiment, the voltage value of the voltage V_VDDA of the power source VDDA is maintained at 1.1 volts. An absolute value of an average current value of the current I_VDDA of the power source VDDA is about 4.0007 mA. A voltage value of the output voltage VOUT is approximately 1.8944 volts. A current value of the output current IOUT is approximately 2.0018 mA. Therefore, the efficiency of the charge pump circuit 100 is 86.2%. It should be noted that the efficiency of the dual-phase charge pump circuit 10 shown in FIG. 1 is approximately 56%. Therefore, the efficiency of the charge pump circuit 100 is significantly greater than that of the dual-phase charge pump circuit 10.

Figure 4:
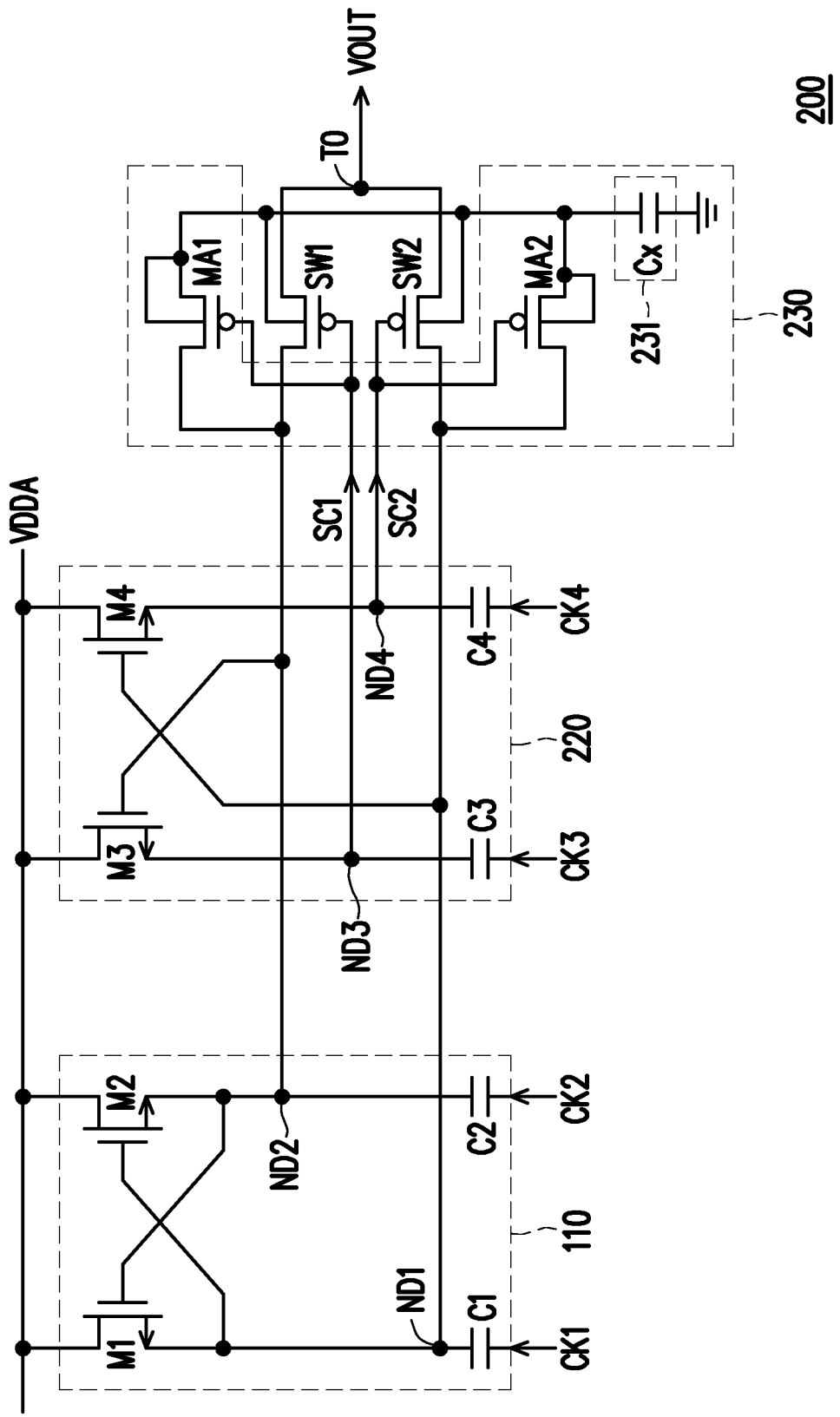
FIG. 4 is a schematic diagram illustrating a charge pump circuit according to a second embodiment of the disclosure.

With reference to FIG. 4, FIG. 4 is a schematic diagram illustrating a charge pump circuit according to a second embodiment of the disclosure. In this embodiment, a charge pump circuit 200 includes the dual-phase charge pump 110, the load switches SW1 and SW2, and a control circuit 220. The implementation of the dual-phase charge pump 110 is clearly described in the first embodiment, so repeated description is not provided herein. In this embodiment, the control circuit 220 includes control transistors M3 and M4 and control capacitors C3 and C4. A first terminal of the control transistor M3 is coupled to the power source VDDA. A second terminal of the control transistor M3 is coupled to the node ND3. A control terminal of the control transistor M3 is coupled to the node ND2. A first terminal of the control transistor M4 is coupled to the power source VDDA. A second terminal of the control transistor M4 is coupled to the node ND4. A control terminal of the control transistor M4 is coupled to the node ND1. The control capacitor C3 is coupled between the node ND3 and the clock CK3. The control capacitor C4 is coupled between the node ND4 and the clock CK4.

In this embodiment, a control terminal of the load switch SW1 is coupled to the node ND3. A control terminal of the load switch SW2 is coupled to the node ND4. The control circuit 220 provides a first control signal SC1 in response to the clock CK3. The control circuit 220 controls the load switch SW1 through the first control signal SC1. In addition, the control circuit 220 further provides a second control signal SC2 in response to the clock CK4. The control circuit 220 controls the load switch SW2 through the second control signal SC2.

With reference to FIG. 3 and FIG. 4 together, in this embodiment, in the period during which the pumping voltage VP1 is generated (i.e., the time interval from the time point t3 to the time point t6), the pumping voltage VP2 is not generated. Therefore, the control transistor M3 is turned off. The control transistor M4 is turned on. A voltage level of the node ND3 is pumped up based on clock CK3. A voltage level of the node ND4 is substantially equal to a voltage level of the power source VDDA. Since the time points t1 and t2 are considerably close, based on the delay of the control capacitor C3, the transition of the clock CK3 may still cause the voltage level of the node ND3 to be pumped up to generate the first control signal SC1 with a first voltage level. The first voltage level is greater than the voltage level of the power source VDDA. Therefore, the load switch SW1 is turned off in response to the first control signal SC1 with the first voltage level. Therefore, the load switch SW2 is turned on in response to the second control signal SC2 with the voltage level of the power source VDDA.

In the time interval at which the pumping voltage VP2 is generated, the pumping voltage VP1 is not generated. Therefore, the control transistor M4 is turned off. The control transistor M3 is turned on. Since the time points 5 and t6 are considerably close, based on the delay of the control capacitor C4, the transition of the clock CK4 may still cause the voltage level of the node ND4 to be pumped up to generate the second control signal SC2 with the first voltage level. Therefore, the load switch SW2 is turned off in response to the second control signal SC2 with the first voltage level. The voltage level of the node ND3 is substantially equal to the voltage level of the power source VDDA. Therefore, the load switch SW1 is turned on in response to the first control signal SC1 with the voltage level of the power source VDDA.

In this embodiment, the charge pump circuit 200 further includes an adjustment circuit 230. The adjustment circuit 230 is coupled to the control circuit 220 and the load switches SW1 and SW2. The adjustment circuit 230 adjusts a base electrode biasing value of the load switches SW1 and SW2 in response to the pumping voltages VP1 and VP2, the first control signal SC1, and the second control signal SC2.

In this embodiment, the adjustment circuit 230 includes adjustment transistors MA1 and MA2 and a charge storage circuit 231. A first terminal of the adjustment transistor MA1 is coupled to the node ND2. A second terminal of the adjustment transistor MA1 and a base electrode of the adjustment transistor MA1 are coupled to a based electrode of the load switch SW1. A control terminal of the adjustment transistor MA1 is coupled to the node ND3. A first terminal of the adjustment transistor MA2 is coupled to the node ND1. A second terminal of the adjustment transistor MA2 and a base electrode of the adjustment transistor MA2 are coupled to a based electrode of the load switch SW2. A control terminal of the adjustment transistor MA2 is coupled to the node ND4. The charge storage circuit 231 is coupled to the second terminal of the adjustment transistor MA1 and the second terminal of the adjustment transistor MA2. The charge storage circuit 231 stores charges of the pumping voltages VP1 and VP2 to generate an auxiliary biasing value Vx for determining the base electrode biasing value. In this embodiment, the base electrode biasing value is adjusted based on the auxiliary biasing value Vx to be greater than a voltage value at the output terminal TO. In this way, the adjustment circuit 230 may prevent a latch-up effect from occurring in the load switches SW1 and SW2.

It should be noted that the second terminal of the control transistor M3 is coupled to the control terminal of the adjustment transistor MA1 and the control terminal of the load switch SW1. The second terminal of the control transistor M4 is coupled to the control terminal of the adjustment transistor MA2 and the control terminal of the load switch SW2. The control transistors M3 and M4 do not become the flow paths of the reverse leakage current. In addition, the second terminals of the adjustment transistors MA1 and MA2 are commonly coupled to the base electrodes of the load switches SW1 and SW2. Therefore, the adjustment transistors MA1 and MA2 do not become the flow paths of the reverse leakage current.

In this embodiment, the control circuit 220 does not execute the transmission of the pumping voltages VP1 and VP2, but controls the load switches SW1 and SW2 and the adjustment transistors MA1 and MA2. Therefore, a layout area of the control transistors M3 and M4 may be allowed to be less than a layout area of the power transistors M1 and M2. In some embodiments, a layout area of the control capacitors C3 and C4 may be allowed to be less than a layout area of the capacitors C1 and C2. For instance, a layout area of the control circuit 220 may be 5% of a layout area of the dual-phase charge pump 110, but the disclosure is not limited thereto.

In this embodiment, the charge storage circuit 231 includes a capacitor Cx. The capacitor Cx is coupled between a reference low voltage (e.g., a ground voltage) and the second ends of the adjustment transistors MA1 and MA2. The capacitor Cx stores the charges of the pumping voltages VP1 and VP2.

Figure 5:
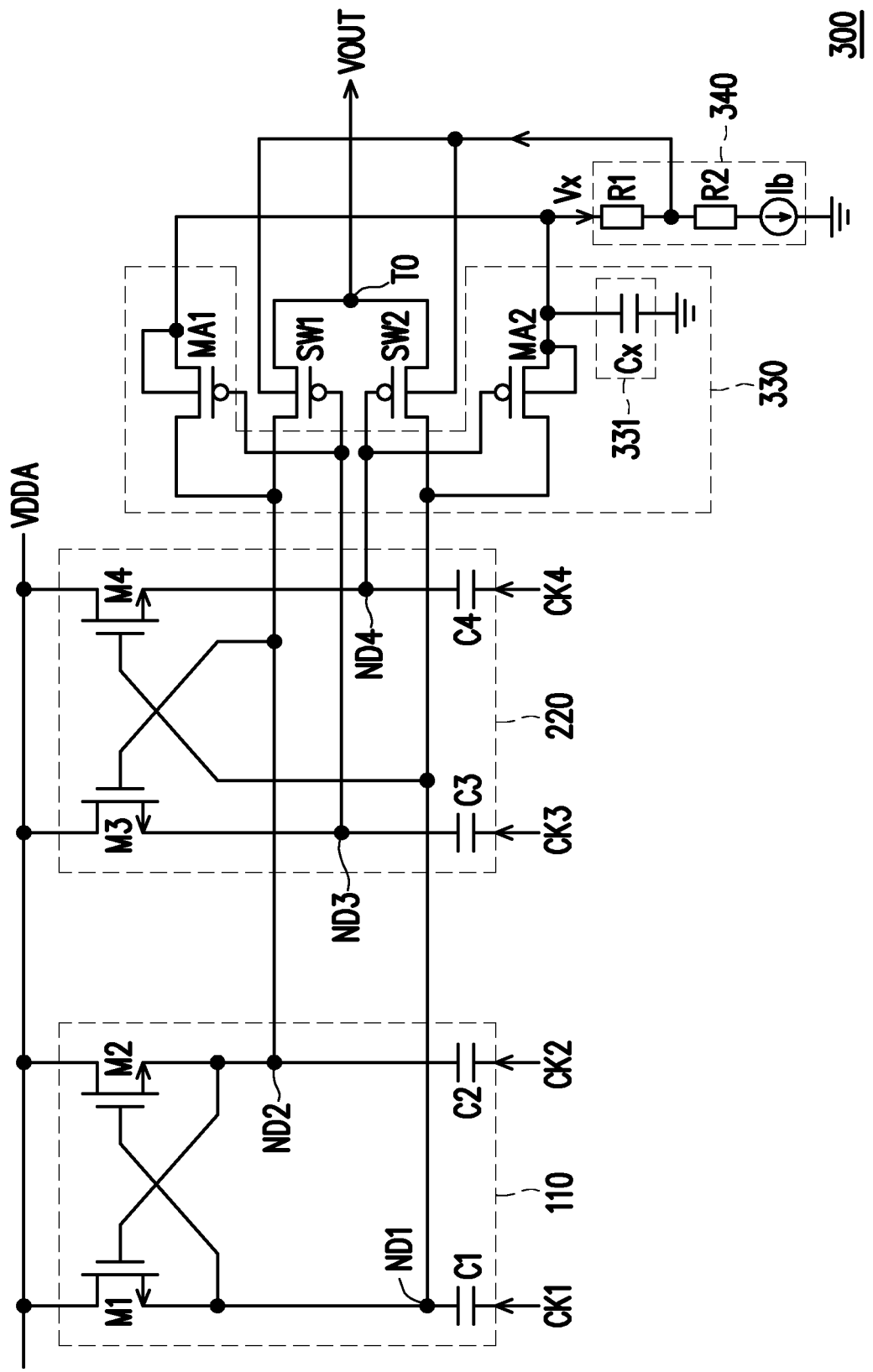
FIG. 5 is a schematic diagram illustrating a charge pump circuit according to a third embodiment of the disclosure.

With reference to FIG. 5, FIG. 5 is a schematic diagram illustrating a charge pump circuit according to a third embodiment of the disclosure. The charge pump circuit 300 includes the dual-phase charge pump 110, the load switches SW1 and SW2, the control circuit 220, an adjustment circuit 330, and a voltage divider circuit 340. The implementation of the dual-phase charge pump 110, the load switches SW1 and SW2, and the control circuit 220 is clearly described in the first embodiment and the second embodiment, so repeated description is not provided herein. In this embodiment, the adjustment circuit 330 includes the adjustment transistors MA1 and MA2 and a charge storage circuit 331. The first terminal of the adjustment transistor MA1 is coupled to the node ND2. The second terminal of the adjustment transistor MA1 and the base electrode of the adjustment transistor MA1 are coupled to the based electrode of the load switch SW1. The control terminal of the adjustment transistor MA1 is coupled to the node ND3. The first terminal of the adjustment transistor MA2 is coupled to the node ND1. The second terminal of the adjustment transistor MA2 and the base electrode of the adjustment transistor MA2 are coupled to the based electrode of the load switch SW2. The control terminal of the adjustment transistor MA2 is coupled to the node ND4. The charge storage circuit 331 is coupled to the second terminal of the adjustment transistor MA1 and the second terminal of the adjustment transistor MA2. The charge storage circuit 331 stores the charges of the pumping voltages VP1 and VP2 to generate the auxiliary biasing value Vx. The voltage divider circuit 340 is coupled to the charge storage circuit 331 and the base electrodes of the load switches SW1 and SW2.

In this embodiment, the charge storage circuit 331 stores the charges of the pumping voltages VP1 and VP2 to generate the auxiliary biasing value Vx. The voltage divider circuit 340 receives the auxiliary biasing value Vx from the charge storage circuit 331 and divides the auxiliary biasing value Vx to generate a base electrode biasing value Vy. Based on the voltage dividing operation of the voltage divider circuit 340, in this way, threshold voltages of the load switches SW1 and SW2 are lowered, and on-resistance values of the load switches SW1 and SW2 are lowered. The load switches SW1 and SW2 may transmit a larger current value, such that the efficiency of the charge pump circuit 300 is improved.

In this embodiment, the voltage divider circuit 340 includes resistors R1 and R2 and a current source Ib. A first terminal of the resistor R1 is coupled to the charge storage circuit 331 to receive the auxiliary biasing value Vx. A second terminal of the resistor R1 is coupled to a voltage divider node. A first terminal of the resistor R2 is coupled to the voltage divider node. The current source Ib is coupled to a second terminal of the resistor R2. The current source Ib is configured to limit an operating current of the voltage divider circuit 340 to control a voltage difference across the resistor R1 and the base electrode biasing value Vy.

Further, the voltage difference across the resistor R1 may be determined based on the operating current provided by the current source Ib. The voltage difference across the resistor R1 is defined to be less than a forward biasing value of a parasitic diode. The voltage difference across the resistor R1 is, for example, 0.5 volts to 0.6 volts. Therefore, the voltage divider circuit 340 may prevent a latch-up effect from occurring in the charge pump circuit 300.

In some embodiments, at least one of the resistors R1 and R2 may be implemented by a variable resistance circuit.

Figure 6:
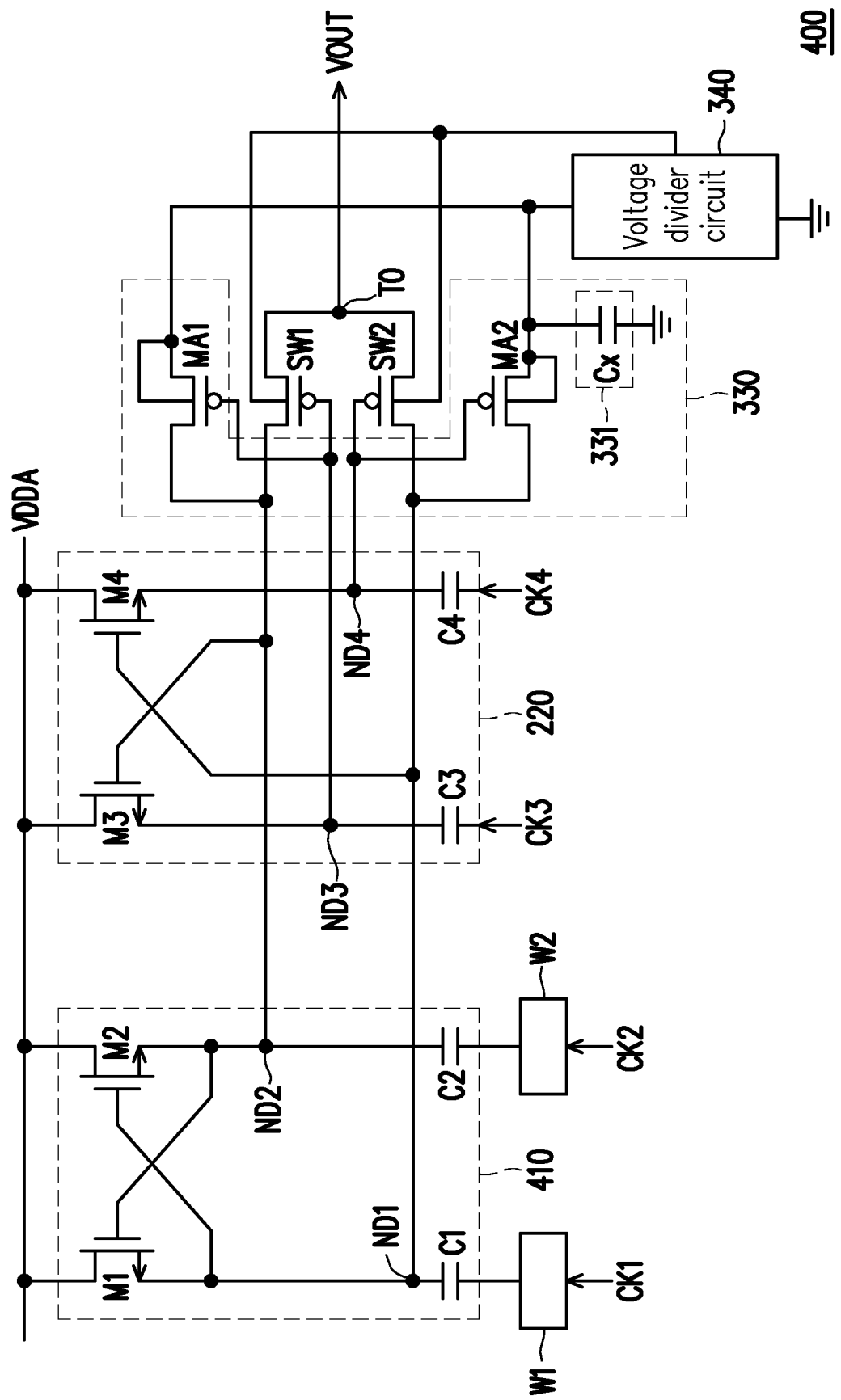
FIG. 6 is a schematic diagram illustrating a charge pump circuit according to a fourth embodiment of the disclosure.

With reference to FIG. 6, FIG. 6 is a schematic diagram illustrating a charge pump circuit according to a fourth embodiment of the disclosure. In this embodiment, a charge pump circuit 400 is disposed on a substrate. The charge pump circuit 400 may be an on-chip circuit. The charge pump circuit 400 includes a dual-phase charge pump 410, the load switches SW1 and SW2, the control circuit 220, the adjustment circuit 330, and the voltage divider circuit 340. The implementation of the load switches SW1 and SW2, the control circuit 220, the adjustment circuit 330, and the voltage divider circuit 340 is clearly described in the foregoing embodiments, so repeated description is not provided herein. In this embodiment, the dual-phase charge pump 410 includes the power transistors M1 and M2 and the capacitors C1 and C2. The first terminal of the power transistor M1 is coupled to the power source VDDA. The second terminal of the power transistor M1 and the control terminal of the power transistor M1 are coupled to the node ND1. The first terminal of the power transistor M2 is coupled to the power source VDDA. The second terminal of the power transistor M2 and the control terminal of the power transistor M2 are coupled to the node ND2.

It should be noted that in this embodiment, a first terminal of the capacitor C1 is coupled to the node ND1. A second terminal of the capacitor C1 is coupled to a well W1 of the substrate. The capacitor C1 receives the clock CK1 through the well W1. A first terminal of the capacitor C2 is coupled to the node ND2. A second terminal of the capacitor C2 is coupled to a well W2 of the substrate. The capacitor C2 receives the clock CK2 through the well W2.

In this embodiment, when the capacitor C1 receives the clock CK1 through the well W1, the capacitor C1 and the well W1 are treated as being coupled to each other in series. The capacitor C1 and the well W1 are formed together to provide an equivalent capacitance value. Since the well W1 of the substrate has a considerably low capacitance value (that is, a parasitic capacitance value), the equivalent capacitance value is significantly lower than a capacitance value of the capacitor C1. In this way, the node ND1 may have a fast response speed. Both the charging time and the discharging time of the node ND1 may be shortened.

Similarly, when the capacitor C2 receives the clock CK2 through the well W2, the capacitor C2 and the well W2 are treated as being coupled to each other in series. The capacitor C2 and the well W2 are formed together to provide an equivalent capacitance value. Since the well W2 of the substrate has a considerably low capacitance value, the equivalent capacitance value is significantly lower than a capacitance value of the capacitor C2. In this way, the node ND2 may have a fast response speed. Both the charging time and the discharging time of the node ND2 may be shortened.

In this embodiment, the wells W1 and W2 are N-type wells. In some embodiments, the wells W1 and W2 are N-type wells with heavy doping.

In view of the foregoing, in the disclosure, the control circuit of the charge pump circuit controls the first load switch in response to the third clock and controls the second load switch in response to the fourth clock. In the period during which the second load switch is turned off, the first load switch transfers the first pumping voltage to the output terminal. In the period during which the first load switch is turned off, the second load switch transfers the second pumping voltage to the output terminal. In the disclosure, the reverse leakage current is not generated in the charge pump circuit. In this way, the efficiency of the charge pump circuit may be improved. In some embodiments, through the adjustment circuit of the charge pump circuit, the base electrode biasing value of the first load switch and the second load switch may be adjusted to be greater than the voltage value located at the output terminal. In this way, the adjustment circuit may prevent a latch-up effect from occurring in the first load switch and the second load switch. Besides, in some embodiments, the first capacitor of the dual-phase charge pump receives the first clock through the first well. The second capacitor of the dual-phase charge pump receives the second clock through the second well. In this way, the first node and the second node may have fast response speeds. Both the charging time and the discharging time of the first node and the second node may be shortened.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A charge pump circuit, comprising:
   a dual-phase charge pump, configured to perform a voltage pumping operation on a power source in response to a first clock and a second clock to generate a first pumping voltage at a first node and a second pumping voltage at a second node;
   a first load switch, coupled between the second node and an output terminal of the dual-phase charge pump;
   a second load switch, coupled between the first node and the output terminal; and
   a control circuit, coupled to the first load switch and the second load switch, configured to control the first load switch in response to a third clock and control the second load switch in response to a fourth clock,
   wherein the second load switch transfers the first pumping voltage to the output terminal in a period during which the first load switch is turned off,
   wherein the first load switch transfers the second pumping voltage to the output terminal in a period during which the second load switch is turned off;
   wherein the control circuit comprises:
      a first control transistor, wherein a first terminal of the first control transistor is coupled to a voltage source, a second terminal of the first control transistor is coupled to a third node, and a control terminal of the first control transistor is coupled to the second node;
      a second control transistor, wherein a first terminal of the second control transistor is coupled to the voltage source, a second terminal of the second control transistor is coupled to a fourth node, and a control terminal of the second control transistor is coupled to the first node;
      a first control capacitor, coupled between the third node and the third clock; and
      a second control capacitor, coupled between the fourth node and the fourth clock,
      wherein a control terminal of the first load switch is coupled to the third node,
      wherein a control terminal of the second load switch is coupled to the fourth node;
      wherein the first node, the second node, the third node and the fourth node are different from each other.

2. The charge pump circuit according to claim 1, wherein the dual-phase charge pump comprises:
   a first power transistor, wherein a first terminal of the first power transistor is coupled to the power source, a second terminal of the first power transistor of the first power transistor is coupled to the first node, and a control terminal of the first power transistor is coupled to the second node;
   a second power transistor, wherein a first terminal of the second power transistor is coupled to the power source, a second terminal of the second power transistor of the second power transistor is coupled to the second node, and a control terminal of the second power transistor is coupled to the first node;
   a first capacitor, coupled between the first node and the first clock; and
   a second capacitor, coupled between the second node and the second clock.

3. The charge pump circuit according to claim 2, wherein:
   the charge pump circuit is provided with a substrate,
   a first terminal of the first capacitor is coupled to the first node,
   a second terminal of the first capacitor is coupled to a first well of the substrate and receives the first clock through the first well,
   a first terminal of the second capacitor is coupled to the second node, and
   a second terminal of the second capacitor is coupled to a second well of the substrate and receives the second clock through the second well.

4. The charge pump circuit according to claim 1, wherein:
   a first transition time point at which the first clock transitions from a low voltage level to a high voltage level is later than a time point at which the third clock transitions from a low voltage level to a high voltage level,
   a time point at which the fourth clock transitions from a high voltage level to a low voltage level is later than the first transition time point, a second transition time point at which the first clock transitions from the high voltage level to the high voltage level is later than a time point at which the fourth clock transitions from the low voltage level to the high voltage level, and a time point at which the third clock transitions from the high voltage level to the low voltage level is later than the second transition time point.

5. The charge pump circuit according to claim 4, wherein:

a third transition time point at which the second clock transitions from a low voltage level to a high voltage level is later than a time point at which the first clock transitions from the high voltage level to the low voltage level, the time point at which the third clock transitions from the high voltage level to the low voltage level is later than the third transition time point, a fourth transition time point at which the second clock transitions from the high voltage level to the high voltage level is later than the time point at which the fourth clock transitions from the low voltage level to the high voltage level, and the time point at which the fourth clock transitions from the high voltage level to the low voltage level is later than the fourth transition time point.

6. The charge pump circuit according to claim 1, wherein the control circuit provides a first control signal configured for controlling the first load switch in response to the third clock and provides a second control signal configured for controlling the second load switch in response to the fourth clock.

7. The charge pump circuit according to claim 6, wherein:

each of the first load switch and the second load switch is a field-effect transistor, and the charge pump circuit further comprises:

an adjustment circuit, coupled to the control circuit, the first load switch, and the second load switch, configured to adjust a base electrode biasing value of the first load switch and the second load switch in response to the first pumping voltage, the second pumping voltage, the first control signal, and the second control signal.

8. The charge pump circuit according to claim 7, wherein the adjustment circuit comprises:

a first adjustment transistor, wherein a first terminal of the first adjustment transistor is coupled to the second node, a second terminal of the first adjustment transistor and a base electrode of the first adjustment transistor are coupled to a base electrode of the first load switch, and a control terminal of the first adjustment transistor is coupled to the third node;

a second adjustment transistor, wherein a first terminal of the second adjustment transistor is coupled to the first node, a second terminal of the second adjustment transistor and a base electrode of the second adjustment transistor are coupled to a base electrode of the second load switch, and a control terminal of the second adjustment transistor is coupled to the fourth node; and a charge storage circuit, coupled to the second terminal of the first adjustment transistor and the second terminal of the second adjustment transistor, configured to store charges of the first pumping voltage and the second pumping voltage through a storage circuit to generate an auxiliary biasing value for determining the base electrode biasing value.

9. The charge pump circuit according to claim 8, wherein the adjustment circuit further comprises:

a voltage divider circuit, coupled to the charge storage circuit, the base electrode of the first load switch, and the base electrode of the second load switch, configured to receive the auxiliary biasing value from the charge storage circuit and divide the auxiliary biasing value to generate the base electrode biasing value.

* * * * *